(12) United States Patent
Roohparvar et al.

(10) Patent No.: US 9,197,251 B2
(45) Date of Patent: Nov. 24, 2015

(54) METHOD AND APPARATUS FOR READING DATA FROM NON-VOLATILE MEMORY

(71) Applicant: MICRON TECHNOLOGY, INC., Boise, ID (US)

(72) Inventors: Frankie Roohparvar, Monte Sereno, CA (US); Vishal Sarin, Saratoga, CA (US); William Radke, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/245,662

(22) Filed: Apr. 4, 2014

(65) Prior Publication Data

US 2014/0237326 A1 Aug. 21, 2014

Related U.S. Application Data (63) Continuation of application No. 13/929,319, filed on Jun. 27, 2013, now Pat. No. 8,719,680, which is a continuation of application No. 11/944,168, filed on Nov. 21, 2007, now Pat. No. 8,499,229.

(51) Int. Cl.
| | |
|---|---|
| *H03M 13/03* | (2006.01) |
| *G11C 29/00* | (2006.01) |
| *H03M 13/23* | (2006.01) |
| *G06F 11/10* | (2006.01) |

(Continued)

(52) U.S. Cl.
CPC ........... *H03M 13/23* (2013.01); *G06F 11/1068* (2013.01); *G11C 16/26* (2013.01); *G11C 29/04* (2013.01)

(58) Field of Classification Search
None
See application file for complete search history.

(56) References Cited

U.S. PATENT DOCUMENTS

| | | | |
|---|---|---|---|
| 4,949,309 A | * 8/1990 | Rao | ......................... 365/185.12 |
| 5,272,706 A | 12/1993 | Park | |

(Continued)

FOREIGN PATENT DOCUMENTS

| | | |
|---|---|---|
| JP | 10-162503 | 6/1998 |
| JP | 11-066887 | 3/1999 |

(Continued)

OTHER PUBLICATIONS

Taiwanese Office Action of Sep. 15, 2014 for Taiwanese Patent Application No. 097143563, filed Nov. 11, 2008. 8 pages, 6 page translation.

(Continued)

*Primary Examiner* — Daniel McMahon
(74) *Attorney, Agent, or Firm* — Knobbe, Martens, Olson & Bear, LLP (57) ABSTRACT

Methods and apparatus are disclosed related to a memory device, such as a flash memory device that includes an array of memory cells. One such method includes detecting values of charges stored in selected memory cells in the memory cell array. The method also includes processing the detected values in accordance with a Viterbi algorithm so as to determine data stored in the selected memory cells. In one embodiment, the flash memory cell array includes word lines and bit lines. Detecting the values of charges includes detecting values of charges stored in a selected row of memory cells by selecting one of the word lines. The Viterbi algorithm provides correct data where inter-signal interference between the cells affects the accuracy of read data.

20 Claims, 9 Drawing Sheets (51) Int. Cl.
*G11C 16/26* (2006.01)
*G11C 29/04* (2006.01)

(56) References Cited

U.S. PATENT DOCUMENTS

| | | | |
|---|---|---|---|
| 5,942,004 A | 8/1999 | Cappelletti | |
| 5,956,743 A | 9/1999 | Bruce et al. | |
| 6,023,781 A | 2/2000 | Hazama | |
| 6,128,222 A * | 10/2000 | Moreaux | 365/185.18 |
| 6,175,522 B1 | 1/2001 | Fang | |
| 6,279,133 B1 | 8/2001 | Vafai | |
| 6,317,376 B1 | 11/2001 | Tran et al. | |
| 6,591,394 B2 | 7/2003 | Lee et al. | |
| 6,628,723 B1 | 9/2003 | Gerlach et al. | |
| 6,683,817 B2 | 1/2004 | Wei et al. | |
| 6,687,179 B2 | 2/2004 | Baker | |
| 6,731,538 B2 | 5/2004 | Noda | |
| 6,732,322 B1 | 5/2004 | Miyauchi et al. | |
| 6,751,766 B2 | 6/2004 | Guterman et al. | |
| 6,831,856 B2 | 12/2004 | Pashmakov | |
| 6,839,870 B2 | 1/2005 | Fanfelle | |
| 6,871,303 B2 | 3/2005 | Halter | |
| 6,895,543 B2 | 5/2005 | Hazama | |
| 7,061,804 B2 | 6/2006 | Chun et al. | |
| 7,149,951 B2 | 12/2006 | Seo | |
| 7,184,356 B2 | 2/2007 | Noguchi et al. | |
| 7,227,782 B2 | 6/2007 | Lee et al. | |
| 7,463,516 B2 | 12/2008 | Ban | |
| 7,478,314 B1 | 1/2009 | Cheong et al. | |
| 7,505,312 B2 | 3/2009 | Matsunaga et al. | |
| 7,643,342 B2 | 1/2010 | Litsyn et al. | |
| 7,844,879 B2 | 11/2010 | Ramamoorthy et al. | |
| 7,904,780 B2 | 3/2011 | Brandman | |
| 7,962,831 B2 | 6/2011 | Park et al. | |
| 8,020,081 B2 | 9/2011 | Kong et al. | |
| 8,046,542 B2 * | 10/2011 | Radke | 711/157 |
| 8,051,358 B2 | 11/2011 | Radke | |
| 8,065,583 B2 | 11/2011 | Radke | |
| 8,327,245 B2 | 12/2012 | Radke | |
| 8,499,229 B2 | 7/2013 | Roohparvar et al. | |
| 8,719,680 B2 | 5/2014 | Roohparvar et al. | |
| 2002/0120820 A1 | 8/2002 | Higuchi et al. | |
| 2003/0156454 A1 | 8/2003 | Wei et al. | |
| 2004/0240255 A1 | 12/2004 | Smith et al. | |
| 2004/0268065 A1 * | 12/2004 | Hilton et al. | 711/156 |
| 2005/0114587 A1 | 5/2005 | Chou et al. | |
| 2006/0221752 A1 | 10/2006 | Fasoli et al. | |
| 2007/0061689 A1 | 3/2007 | Park et al. | |
| 2007/0124647 A1 * | 5/2007 | Chen et al. | 714/763 |
| 2007/0171714 A1 | 7/2007 | Wu et al. | |
| 2007/0171730 A1 * | 7/2007 | Ramamoorthy et al. | 365/185.33 |
| 2007/0266295 A1 | 11/2007 | Conley | |
| 2007/0266296 A1 | 11/2007 | Conley | |
| 2008/0137414 A1 * | 6/2008 | Park et al. | 365/185.03 |
| 2008/0163023 A1 | 7/2008 | Hong et al. | |
| 2008/0168319 A1 | 7/2008 | Lee et al. | |
| 2008/0320361 A1 | 12/2008 | Fukuda et al. | |
| 2009/0013233 A1 | 1/2009 | Radke | |
| 2009/0013234 A1 | 1/2009 | Radke | |
| 2009/0100307 A1 | 4/2009 | Lee | |
| 2009/0132889 A1 | 5/2009 | Radke | |
| 2010/0023800 A1 | 1/2010 | Harari et al. | |
| 2010/0115376 A1 | 5/2010 | Shalvi et al. | |
| 2011/0060969 A1 | 3/2011 | Ramamoorthy et al. | |

FOREIGN PATENT DOCUMENTS

| | | |
|---|---|---|
| JP | 11-136139 | 5/1999 |
| JP | 2000149592 | 5/2000 |
| JP | 2001-332096 | 11/2001 |
| JP | 2004-310807 | 11/2004 |
| JP | 2005-078721 | 3/2005 |
| JP | 2005-527062 | 9/2005 |
| JP | 2006-500729 | 1/2006 |
| JP | 2006-294229 | 10/2006 |
| JP | 2006-527901 | 12/2006 |
| JP | 2007-207333 | 8/2007 |
| JP | 2007-226897 | 9/2007 |
| JP | 2007-257748 | 10/2007 |
| JP | 2009-516318 | 4/2009 |
| JP | 2009-524176 | 6/2009 |
| KR | 100766042 | 10/2007 |
| WO | WO 2006070668 | 7/2006 |
| WO | WO 2007/058846 | 5/2007 |
| WO | WO2007084751 | 7/2007 |

OTHER PUBLICATIONS

Chinese Office Action of Feb. 28, 2013, for Chinese Patent Application No. 200880117050.0, filed Oct. 28, 2008. 15 pages.
European Office Action of Aug. 16, 2012 for European Patent Application No. 08 854 324.4 filed Oct. 28, 2008. 4 pages.
Extended Search Report dated Jun. 6, 2011 in counterpart European Application 08854324.4 / International Application PCT/US2008/081479.
Office Action of Jun. 6, 2012 for Chinese Patent Application No. 200880117050.0 filed Oct. 28, 2008. 12 pages.
Translation of Notice of Rejection of Jul. 30, 2013 from Japanese Patent Application No. 2010-534995 filed Oct. 28, 2008. 5 Pages.
Notice of Rejection of Mar. 11, 2014 from Japanese Patent Application No. 2010-534995 filed Oct. 28, 2008. 6 pages.
European Office Action of Aug. 28, 2014 for European Patent Application No. 08 854 324.4, filed on Oct. 28, 2008. 5 pages.
International Search Report dated Jun. 29, 2009 in International Application PCT/US2008/081479.
Korean Office Action of Dec. 16, 2013 for corresponding Korean Patent Application No. 10 2010 7013544 filed on Oct. 28, 2008. 3 pages, 1 page translation.
Japanese Office Action of Mar. 5, 2013 for Japanese Patent Application No. 2010-534995, filed Oct. 28, 2008. 6 pages.

* cited by examiner

|     | $b_0$ | $b_1$ | $b_2$ | $b_3$ |
|-----|-------|-------|-------|-------|
| (1) | 1     | 0     | 1     | 1     |
|     | 0     | 8     | 0     | 0     |

*FIG. 3A*

|          | $b_0$ | $b_1$ | $b_2$ | $b_3$ |
|----------|-------|-------|-------|-------|
| (1 or 0) | 1     | 0     | 0     | 1     |
|          | 0     | 11    | 5     | 0     |

|       | $b_1$ | $b_2$ | $b_3$ | $b_4$ |
|-------|-------|-------|-------|-------|
| row 1 | 1     | 0     | 1     | 1     |

WRITE OPERATION

*FIG. 5A*

|       | $b_1$ | $b_2$ | $b_3$ | $b_4$ |
|-------|-------|-------|-------|-------|
| row 1 | ?     | ?     | ?     | ?     |
| Sensed number of electrons | 0 | 11 | 5 | 0 |

READ OPERATION

*FIG. 5B*

|     | $b_0$ | $b_1$ | $b_2$ | $b_3$ | $b_4$ |
|-----|-------|-------|-------|-------|-------|
| RE→ | (1)   | 0     | 11    | 5     | 0     |

FIG. 6A

|     | $b_0$ | $b_1$ | $b_2$ | $b_3$ | $b_4$ |
|-----|-------|-------|-------|-------|-------|
| RE→ |       | 0     | 11    | 5     | 0     |

FIG. 6B

|     | $b_0$ | $b_1$ | $b_2$ | $b_3$ | $b_4$ |
|-----|-------|-------|-------|-------|-------|
| RE→ |       | 0     | 11    | 5     | 0     |

METHOD AND APPARATUS FOR READING DATA FROM NON-VOLATILE MEMORY

CROSS REFERENCE TO RELATED APPLICATIONS

This application is a continuation of U.S. patent application Ser. No. 13/929,319, filed Jun. 27, 2013, titled "METHOD AND APPARATUS FOR READING DATA FROM NON-VOLATILE MEMORY," which is a continuation of U.S. patent application Ser. No. 11/944,168, filed Nov. 21, 2007, titled "METHOD AND APPARATUS FOR READING DATA FROM FLASH MEMORY," the disclosures of which is hereby incorporated by reference in their entireties herein.

BACKGROUND

1. Field of the Invention

Embodiments of the invention relate to memory devices, and more particularly, in one or more embodiments, to flash memory devices.

2. Description of the Related Art

Flash memory devices are non-volatile memory devices which store information on a semiconductor in a way that needs no power to maintain the information stored therein. Flash memory devices typically include an array of memory cells in a matrix form having columns and rows. Each memory cell includes a charge storage node, such as a floating gate transistor formed on a semiconductor substrate. The cells are arranged to form strings such that the source of the transistor of each cell is coupled to the drain of the transistor of a neighboring cell in each string. The memory cell array includes sense lines (often referred to as bit lines), each of which connects to a column of cells in the memory cell array. The memory cell array also includes select lines (often referred to as word lines), extending perpendicular to the bit lines and parallel to one another. Each of the word lines connects to the control gates of the transistors in a row of cells in the memory cell array.

As the geometry of a flash memory is reduced, distances between cells in the memory cell array are also reduced. These reduced distances may incur inter-signal interference (ISI) between neighboring memory cells. The term "inter-signal interference" refers to electromagnetic effect of electrons trapped in the charge storage node of one memory cell on a neighboring memory cell. The inter-signal interference may affect the operation of a flash memory device. Therefore, there is a need for an error-correcting logic or algorithm for flash memory devices with a reduced size.

BRIEF DESCRIPTION OF THE DRAWINGS

The embodiments will be better understood from the Detailed Description of Embodiments and from the appended drawings, which are meant to illustrate and not to limit the embodiments, and wherein.

DETAILED DESCRIPTION OF EMBODIMENTS

As described above, as the geometry of a flash memory device is reduced, distances between cells in the memory device are also reduced. In such a flash memory device, inter-signal interference may affect the operation (particularly, data read operation) of the flash memory device. Therefore, there is a need for an error-correcting logic or algorithm for flash memory devices.

In one embodiment, a flash memory device is provided with an error-correcting logic or algorithm for data read operations, based on a Viterbi algorithm or its variant. Raw data read from a flash memory device is processed using the Viterbi algorithm. A graph called a trellis may be constructed to include all possible combinations of data states that can be stored in a row of cells in the flash memory. A data path with a minimum error is determined using a Viterbi algorithm, thereby providing correct data.

Figure 1:
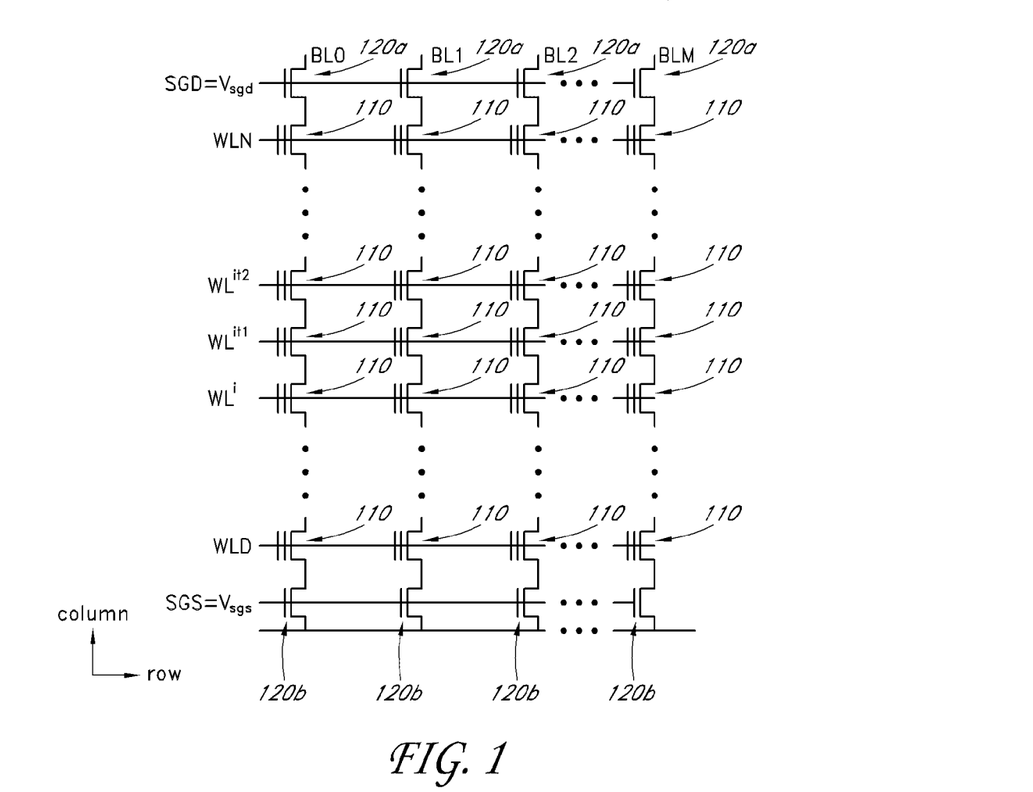
FIG. 1 is a schematic diagram of a memory cell array of a NAND flash memory device according to one embodiment.

FIG. 1 illustrates a NAND flash memory array according to one embodiment. The illustrated flash memory array includes first to M-th bit lines BL0-BLM and first to N-th word lines WL0-WLN. The bit lines BL0-BLM extend parallel to one another in a column direction. The word lines WL0-WLN extend parallel to one another in a row direction. The NAND flash memory array also includes select transistors 120a, 120b used for selecting a bit line.

Each bit line includes a string of floating gate transistors coupled in series source to drain. For example, the second bit line BL1 includes floating gate transistors 110 connected in series. The control gates of floating gate transistors 110 of cells in the same row are coupled to the same word line. Each of the floating gate transistors 110 forms a memory cell that stores a charge (or a lack of charge), wherein the amount of stored charge can be used to represent, for example, one or more states, and wherein the one or more states can represent one or more digits (e.g., bits) of data. The memory cell can be either a single-level cell (SLC) or a multi-level cell (MLC). In one embodiment, the amounts of charge stored in the floating gate transistors 110 may be detected by sensing currents flowing through the floating gate transistors 110. In another embodiment, the amounts of charge stored in the floating gate transistors 110 may be detected by sensing the threshold voltage values of the floating gate transistors 110.

Figure 2:
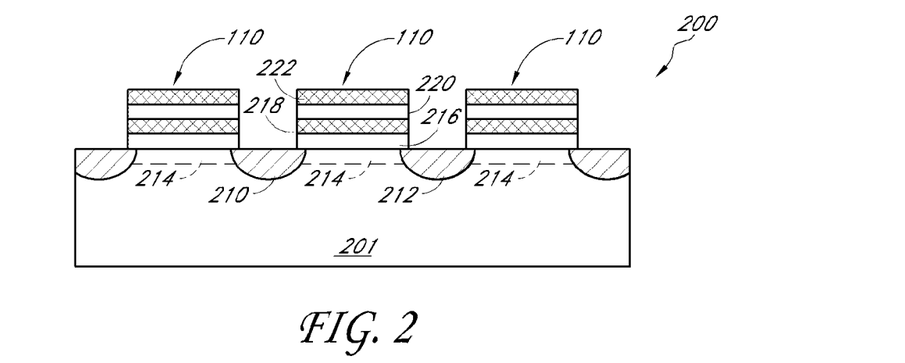
FIG. 2 is a schematic cross-section of the NAND flash memory device of FIG. 1 according to one embodiment.

FIG. 2 illustrates a cross-section of the floating gate transistors 110 in the second bit line BL1. The floating gate transistors 110 are formed on a substrate 201. Each of the floating gate transistors 110 includes a source region 210 (which is a drain region for a neighboring transistor), a drain region 212 (which is a source region for a neighboring transistor), a doped channel region 214, a first dielectric (e.g., a tunnel oxide) 216, a floating gate 218, a second dielectric (e.g., a gate oxide, wherein the tunnel and gate oxide can be formed of the same or different material) 220, and a control gate 222. The tunnel oxide 216 is formed on the channel region 214 to insulate the floating gate 218 from the channel region 214. The gate dielectric 220 physically and electrically separates the floating gate 218 from the control gate 222. The control gate 222 is coupled to an appropriate word line, e.g., word line WL1. Electrons can be trapped on the floating gate 218 and be used to store data.

Figure 3A:
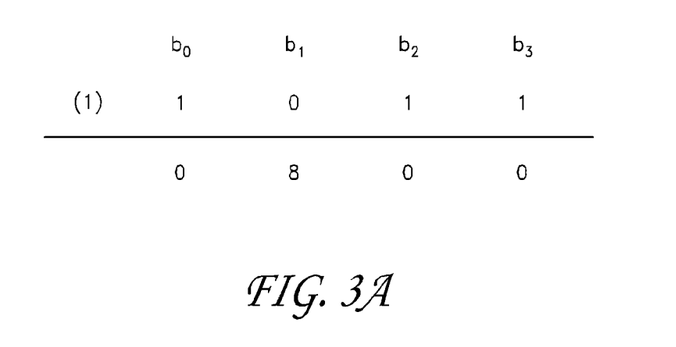
FIG. 3A is a diagram illustrating written data bits and corresponding numbers of trapped electrons in an ideal NAND flash memory array without inter-signal interference.

Referring to FIG. 3A, memory cells include a certain number (including zero) of electrons trapped therein, depending on the stored data. For the sake of illustration, suppose that a floating gate transistor has no trapped electrons in its floating gate to store "1" (can be vice versa). Also suppose that a floating gate transistor forming a memory cell can trap 8 electrons in its floating gate to store "0." The numbers of electrons herein are arbitrary numbers for the sake of explanation, and a skilled artisan will appreciate that the numbers of electrons vary widely depending on the design of the memory cell array.

Ideally, when a stored data bit is "1," a current sensed to detect the state of the memory cell would indicate that the cell has no trapped electrons (i.e., the presence of a current flow). On the other hand, when a stored data bit is "0," a current sensed to detect the state of the memory cell would indicate that the cell has 8 trapped electrons (i.e., the absence of a current flow).

Figure 3B:
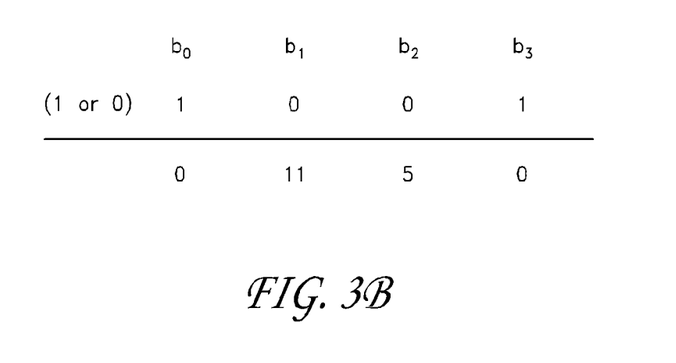
FIG. 3B is a diagram illustrating data bits read from a NAND flash memory array with inter-signal interference.

A current sensed to detect the state of the memory cell may indicate that the number of trapped electrons is in a continuous range rather than either 0 or 8. Therefore, a threshold value for a sensed current is set to determine whether the memory cell has data of either "1" or "0" (or more states for multi-level cells). In the illustrated example, the threshold value can be 4, i.e., if there are 4 or more trapped electrons, the stored data is "0"; if there are less than 4 trapped electrons, the stored data is "1." For example, in FIG. 3B, the trapped electrons are 0, 11, 5, and 0 in a row of memory cells. The trapped electrons indicate that the stored data $b_0$, $b_1$, $b_2$, $b_3$ are 1, 0, 0, 1.

Figure 4:
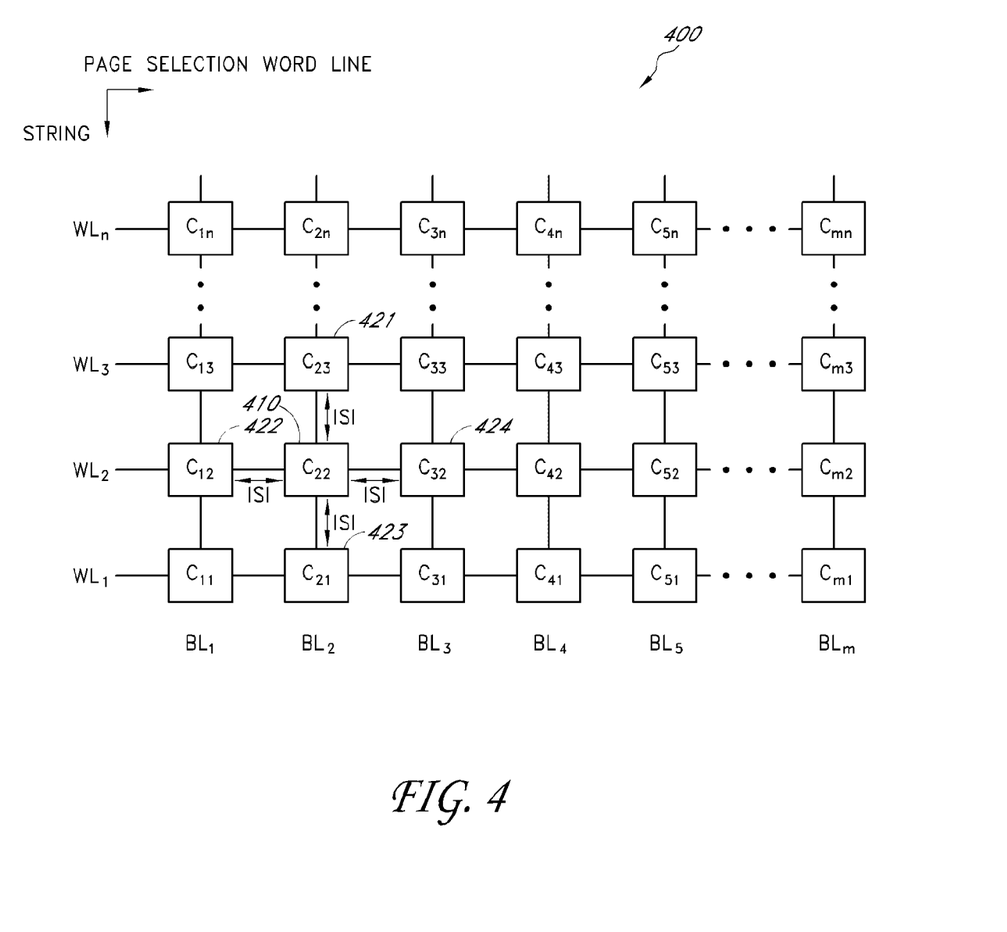
FIG. 4 is a schematic block diagram illustrating a NAND flash memory array having inter-signal interference.

As the geometry of the NAND flash memory is reduced, distances between cells in the memory cell array are also reduced. These reduced distances may incur inter-signal interference (ISI) between neighboring memory cells. Referring to FIG. 4, a NAND flash memory includes a memory cell array 400. In the illustrated embodiment, a memory cell 410 may experience inter-signal interference from neighboring memory cells 421-424 in the same row and/or in the same column.

This inter-signal interference may affect read operations of the NAND flash memory. For example, if one or more of the adjacent memory cells 421-424 has 8 electrons trapped therein, the memory cell 410 may appear when sensed as if it has 2 more electrons than it actually has. For example, the memory cell 410 may appear when sensed as if it has 2 electrons even if it actually has no electrons, or 10 electrons even if it actually has 8 electrons.

Because of the inter-signal interference, when a number of electrons is close to a threshold value, the data can be read inaccurately. For example, when the number of actually trapped electrons is 3, the number sensed may correspond to 5 when there is inter-signal interference. For example, referring back to FIG. 3B, the third bit b2 may be in fact 0 because the read number of electrons ("5") may be a result of inter-signal interference. In the illustrated example, the threshold is "4." The cell storing the third bit b2 may appear as if it has 5 electrons even though it actually has 3 electrons.

Referring to FIGS. 5A-5B and 6A-6J, a method of confirming/correcting data read from a NAND flash memory array according to one embodiment will now be described in detail. In the illustrated embodiment, a Viterbi algorithm is used for confirming/correcting data read from a NAND flash memory. A Viterbi algorithm is an algorithm for finding the most likely sequence of hidden states, which is called the Viterbi path. Given observed patterns of trapped electrons in a row of memory cells, the Viterbi algorithm is used to determine the most likely states of the memory cells in the row in consideration of inter-signal interference.

In the illustrated embodiment, it is assumed that one cell in a row exerts inter-signal interference only on a cell immediately next to the one cell in the same row (e.g., in the left-to-right direction). However, a skilled artisan will appreciate that the Viterbi algorithm can be extended to other neighboring cells around any given cell.

Suppose that a cell storing logic "1" has 0 electrons in its floating gate and that a cell storing logic "0" has 8 electrons in its floating gate. A particular cell is not affected by a neighboring cell immediately next to the particular cell in the same row on the left side, if the neighboring cell stores "1" (e.g., no trapped electrons). If, however, the neighboring cell stores "0" (e.g., 8 trapped electrons), the particular cell may experience inter-signal interference from the neighboring cell as if it has two more electrons in addition to its own trapped electrons.

Figure 5A:
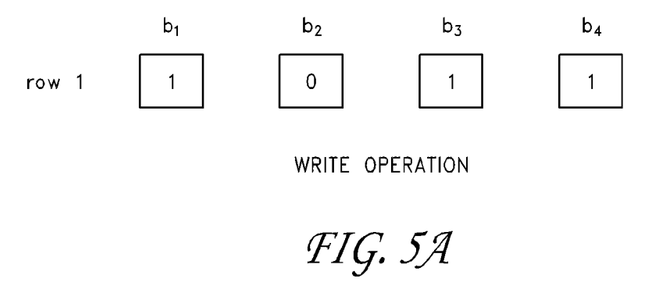
FIG. 5A is a diagram illustrating an example of a write operation on a NAND flash memory.
Figure 5B:
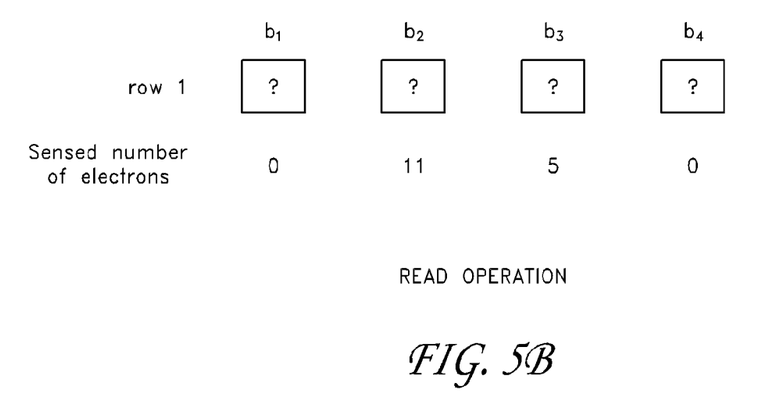
FIG. 5B is a diagram illustrating an example of a read operation on a NAND flash memory.

Referring to FIG. 5A, for the purpose of illustration, suppose that data written on four cells b1-b4 in row 1 are 1, 0, 1, 1. Referring to FIG. 5B, now suppose that sensed information from the cells b1-b4 indicate that the cells b1-b4 store 0, 11, 5, and 0 electrons, respectively. These numbers of electrons for cells b1-b4 will be reused in the example of FIGS. 6A-6J as the read number. If the threshold value is 4 electrons (if there are 4 or more electrons, the stored data is 0; if there are less than 4 electrons, the stored data is 1), the read data can be translated to 1, 0, 0, 1 which is not identical to the written data, 1, 0, 1, 1.

Referring to FIGS. 6A-6J, a Viterbi algorithm is used to confirm/correct the data read from the row of cells b1-b4. In the Viterbi algorithm, a path of minimum error along a trellis is determined to indicate the correct data. Errors associated with data states along the trellis are determined by a deviation D which is represented by Equation 1:

$$D = (RE - PE)^2 \quad (1)$$

In Equation 1, RE is a read number of electrons, and PE is a possible number of electrons in a next state along the trellis. The RE data used will be 0, 11, 5, and 0. As a path is taken along the trellis, the error is accumulated. An accumulated error Ei is represented by Equation 2:

$$Ei = \sum^{i} Di \quad (2)$$

In Equation 2, Ei is an accumulated error at each destination state, and Di is a deviation at the destination state. The alternative paths (from 0 or 1) leading to each state (1 or 0) are compared to one another. Only the path with a minimum error is selected at each destination state. This process is repeated until the paths to all the given states are determined. The selected paths serve to indicate the correct data stored in the memory cells.

In FIGS. 6A-6J, the upper row represents states where a data bit stored in a memory cell is 1 whereas the lower row represents states where a data bit stored in a memory cell is 0. Each number adjacent to an arrow in FIGS. 6A-6J is a number of electrons that can be expected to be sensed in the next cell. The numbers of electrons herein are arbitrary for the sake of explanation, and a skilled artisan will appreciate that the numbers of electrons vary widely depending on the design of the memory cell array and sensitivity of cells and/or sense circuits.

Figure 6A:
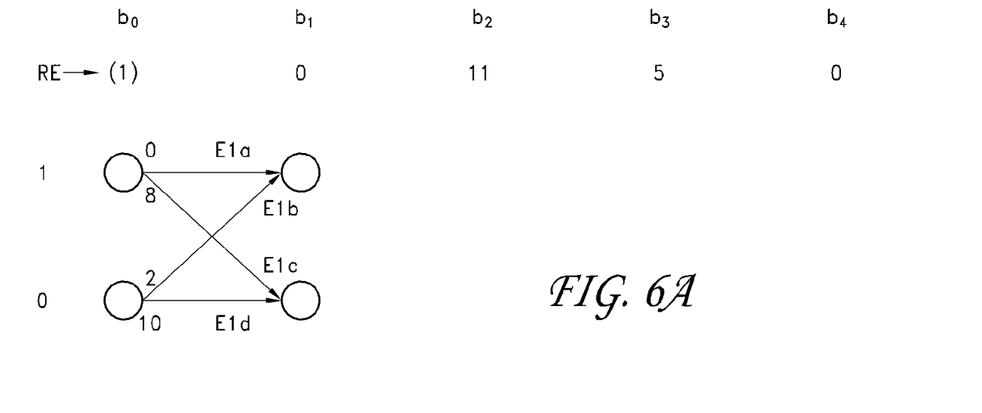
FIGS. 6A-6J illustrate a method of correcting data read from a NAND flash memory array using a Viterbi algorithm according to one embodiment.

The numbers had prior states all "1," i.e., the initial condition is that the accumulated error is 0. In FIG. 6A, the state of an initial cell b0 can be either at 1 or at 0. For the path where the initial cell b0 is at 1 and a first cell b1 is at 1, the possible number of electrons (PE) stored in the first cell b1 is 0 because there is no inter-signal interference by the initial cell b0 on the first cell b1. In the example, the read number of electrons (RE) is 0 for b1, and an accumulated error E1a associated with this path (1 to 1) is $(RE-PE)^2=(0-0)^2=0$.

For the path where the initial cell b0 is at 1 and the first cell b1 is at 0 (path 1 to 0), the possible number of electrons in the first cell b1 is 8 because the first cell b1 would have 8 electrons without inter-signal interference by the initial cell b0. Thus, an accumulated error E1c associated with this path (1 to 0) is $(0-8)^2=64$.

On the other hand, for the path where the initial cell b0 is at 0 and the first cell b1 is at 1, the possible number of electrons sensed is 2 because the first cell b1 would store no electrons therein but experience inter-signal interference (2 electrons) from the initial cell b0. Thus, an accumulated error E1b associated with this path (0 to 1) is $(0-2)^2=4$.

For the path where the initial cell b0 is at 0 and the first cell b1 is at 0, the first cell b1 would store 8 electrons with inter-signal interference (2 electrons) from the initial cell b0, thus acting as if it has 10 electrons. Thus, an accumulated error E1d associated with this path (0 to 0) is $(0-10)^2=100$.

Figure 6B:
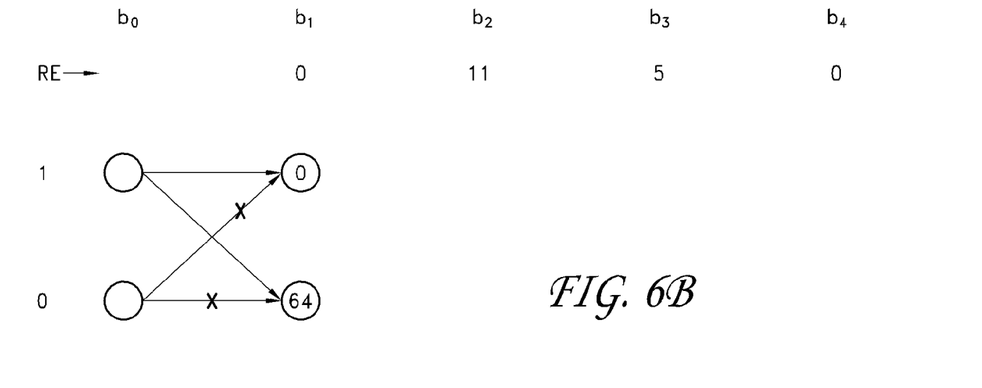

Based on the amounts of the accumulated errors, one of the paths leading to each of the destination states (0 or 1) is eliminated, as indicated by being crossed out. In FIG. 6B, for destination state 1, the arrow from 0 to 1 has been crossed out because the accumulated error E1b associated with this path from 0 to 1 is greater than the accumulated error E1a associated with the other path from 1 to 1. Similarly, the arrow from 0 to 0 has been crossed out because the accumulated error E1d is greater than the accumulated error E1c. The accumulated errors are drawn inside the circles indicating the destination states.

Figure 6C:
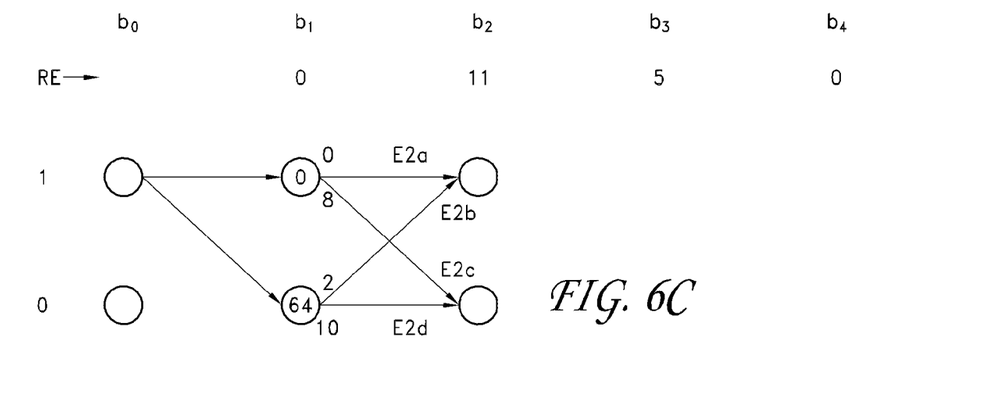

In FIG. 6C, the read number of electrons (RE) for the second cell b2 in the illustrated example is 11. The first cell b1 can be either at 1 or at 0. For the computation of accumulated error, the first cell b1 has 0 for state 1 and 64 for state 0. For the path where the first cell b1 is at 1 and a second cell b2 is at 1, the possible number of electrons sensed for the second cell b2 would be 0 electrons because the second cell b2 has no stored electron therein with no inter-signal interference from the first cell b1. Thus, a deviation D is $(11-0)^2=121$. For the path where the first cell b1 is at 1 and the second cell b2 is at 0, a deviation D is $(11-8)^2=9$. The accumulated errors E2a, E2c are 121 and 9, respectively.

On the other hand, for the path where the first cell b1 is at 0, the accumulated error starts at 64. For the path to destination state 1 of the second cell b2, a deviation D is $(11-2)^2=81$, and an accumulated error E2b is 145 because the accumulated error of the preceding path adds to the deviation of the current path. For the path where the first cell b1 is at 0 and the second cell b2 is at 0, a deviation D is $(11-10)^2=1$, and an accumulated error E2d is 65.

Figure 6D:
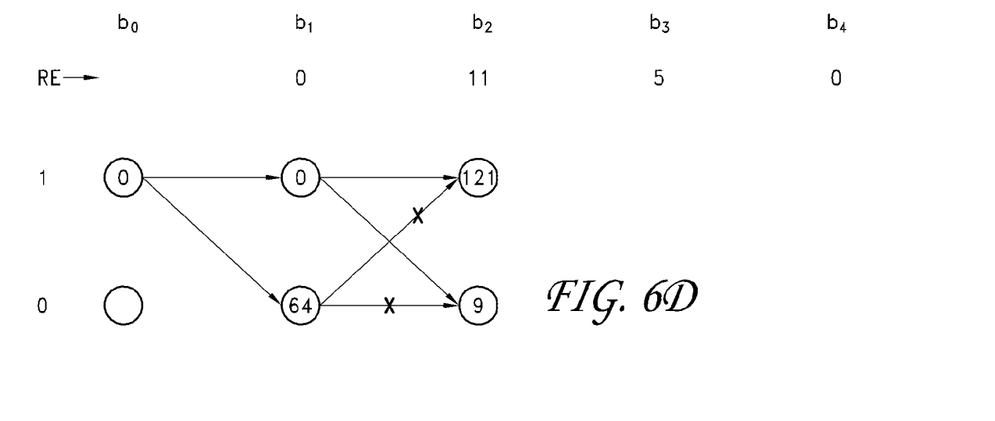

Again, based on the amounts of the accumulated errors, one of the paths leading to each of the destination states (0 or 1) is eliminated, as indicated by being crossed out. In FIG. 6D, the arrow from 0 to 1 has been crossed out because the accumulated error E2b of 145 associated with the path from 0 to 1 is greater than the accumulated error E2a associated with the other path from 1 to 1. Similarly, the arrow from 0 to 0 has been crossed out because the accumulated error E2d associated with the path from 0 to 0 is greater than the accumulated error E2c associated with the other path from 1 to 0.

Figure 6E:
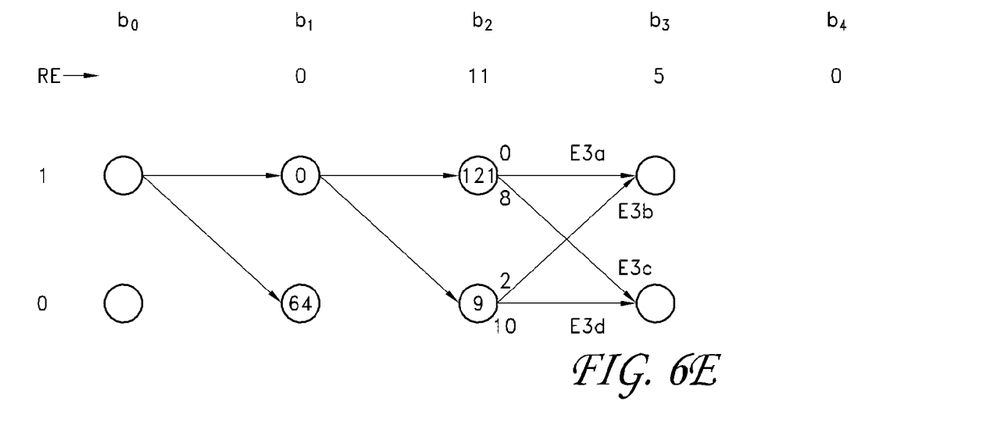

In FIG. 6E, the read number of electrons (RE) for the third cell b3 is 5 for the illustrated example. The state of the second cell b2 can be either at 1 or at 0. For the path where the second cell b2 is at 1 and a third cell b3 is at 1, a deviation D is $(5-0)^2=25$, and an accumulated error E3a is 146. For the path where the second cell b2 is at 1 and the third cell b3 is at 0, a deviation D is $(5-8)^2=9$, and an accumulated error E3c is 130.

On the other hand, for the path where the second cell b2 is at 0, and the third cell b3 is at 1, a deviation D is $(5-2)^2=9$, and an accumulated error E3b is 18. For the path where the second cell b2 is at 0 and the third cell b3 is at 0, a deviation D is $(5-10)^2=25$, and an accumulated error E3d is 34.

Figure 6F:
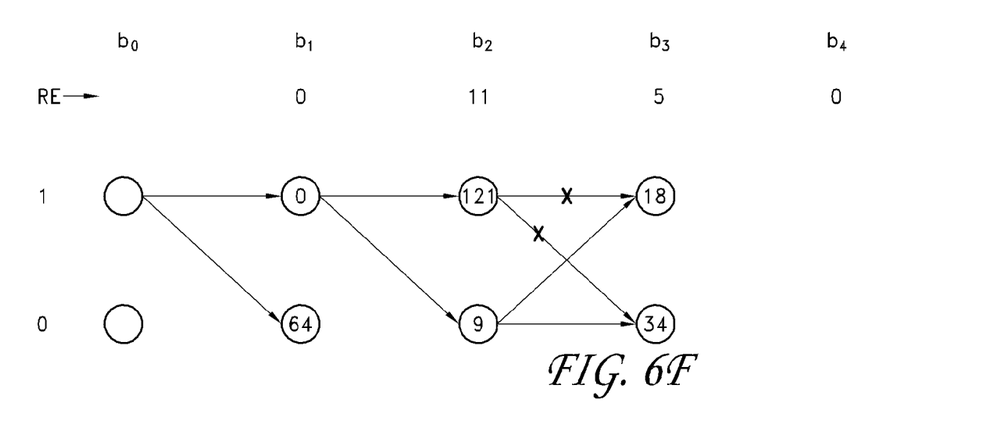

Again, based on the amounts of the accumulated errors, one of the paths leading to each state (0 or 1) is eliminated, e.g., crossed out. In FIG. 6F, the arrow from 1 to 1 has been crossed out because the accumulated error E3a is greater than the accumulated error E3b for the path from 0 to 1. Similarly, the arrow from 1 to 0 has been eliminated because the accumulated error E3c for the path from 1 to 0 is greater than the accumulated error E3d for the path from 0 to 0.

Figure 6G:
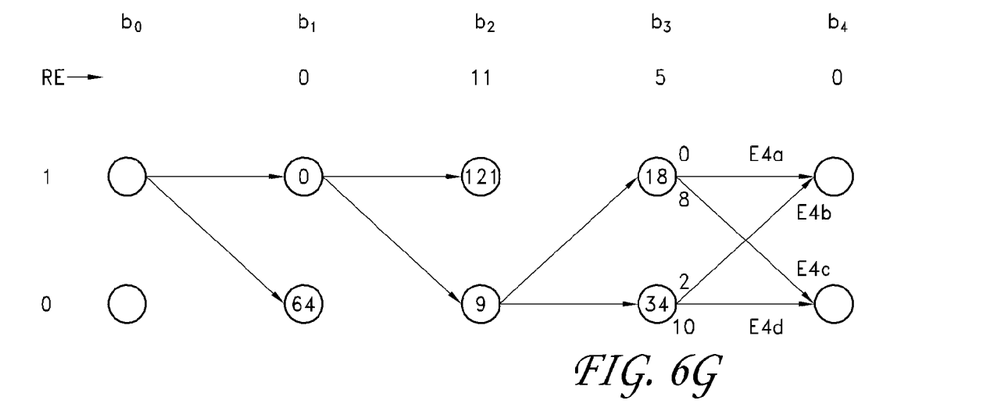

In FIG. 6G, the read number of electrons (RE) for the fourth cell b4 is 0 for the illustrated example. The state of the third cell b3 can be either at 1 or at 0. For the path where the third cell b3 is at 1 and a fourth cell b4 is at 1, a deviation D is $(0-0)^2=0$, and an accumulated error E4a is 18. For the path where the third cell b3 is at 1 and the fourth cell b4 is at 0, a deviation D is $(0-8)^2=64$, and an accumulated error E4c is 82.

On the other hand, for the path where the third cell b3 is at 0 and the fourth cell b4 is at 1, a deviation D is $(0-2)^2=4$, and an accumulated error E4b is 38. For the path where the third cell b3 is at 0 and the fourth cell b4 is at 0, a deviation D is $(0-10)^2=100$, and an accumulated error E4d is 134.

Figure 6H:
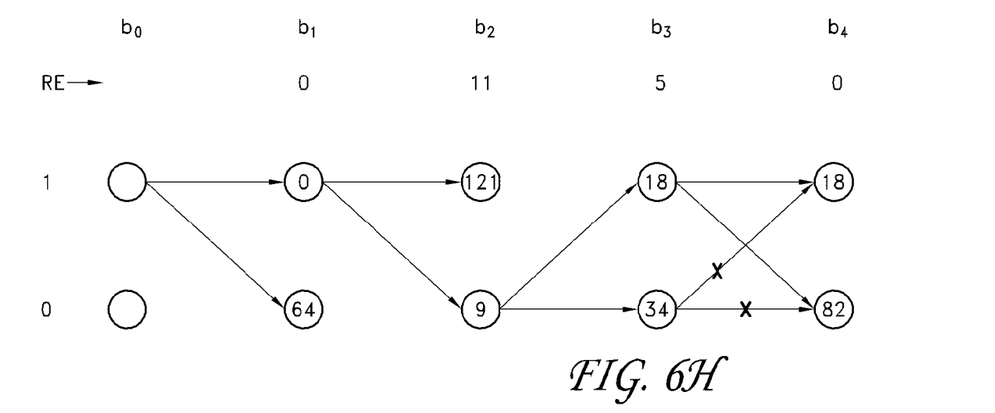

Again, based on the amounts of the accumulated errors, one of the paths leading to each of the states (0 or 1) is eliminated. In FIG. 6H, the arrow from 0 to 1 has been crossed out because the accumulated error E4b for the path from 0 to 1 is greater than the accumulated error E4a for the path from 1 to 1. Similarly, the arrow from 0 to 0 has been crossed out because the accumulated error E4d for the path from 0 to 0 is greater than the accumulated error E4c for the path from 1 to 0.

Figure 6I:
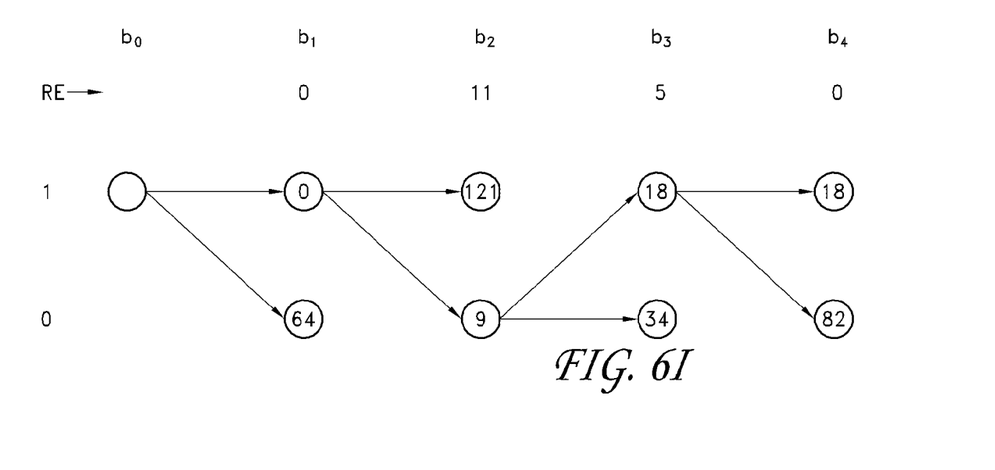
Figure 6J:
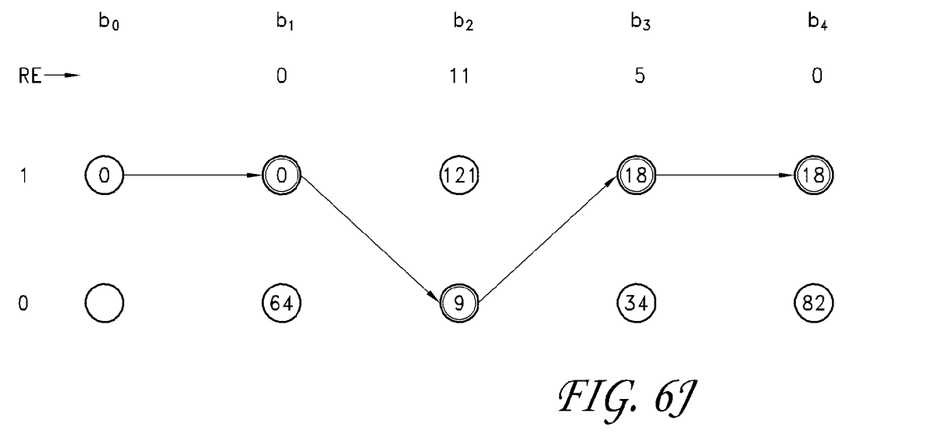

FIG. 6I illustrates a resulting path including the arrows remaining after the completion of the process described above. Now, errors at possible states for the fourth cell b4 are compared to each other. In the illustrated example, for the destination state "1," the accumulated error is 18. For the destination state "0," the accumulated error is 82. The smaller the error is, the more likely the cell has the state. Thus, it is more likely that the fourth cell b4 stores "1." Then, a path is taken backward from state "1" of the fourth cell b4. Thus, the third cell b3 likely stores 1. The second cell b2 likely stores 0. In addition, the first cell b1 likely stores 1. Thus, the correct data is 1, 0, 1, 1, which is identical to the written data, as shown in FIG. 6J.

Figure 7:
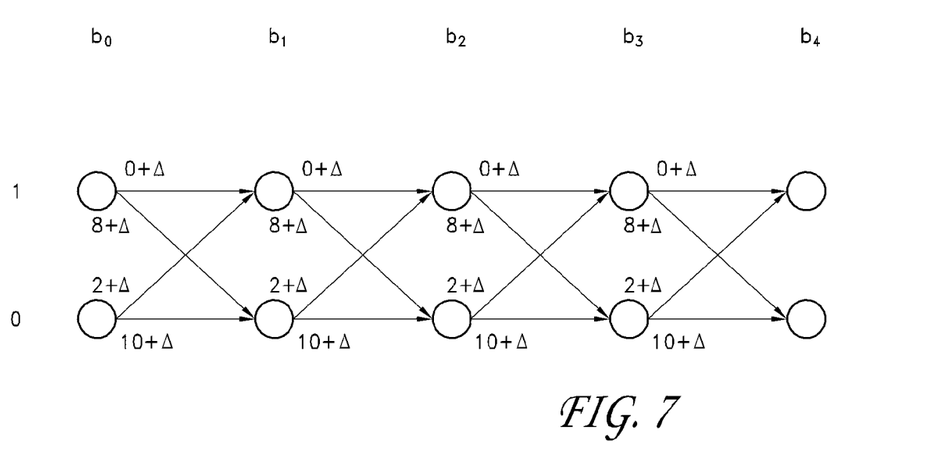
FIG. 7 illustrates a method of correcting data read from a NAND flash memory array using a Viterbi algorithm according to another embodiment.

In another embodiment, inter-signal interference on a particular cell by two or more neighboring cells may be taken into account in determining correct data using a Viterbi algorithm. For example, inter-signal interference on a particular cell by a neighboring cell in a row immediately above the particular cell can be taken into account in processing raw data using the Viterbi algorithm. Referring to FIG. 7, a delta (Δ) is added to a possible number of electrons in each state. The delta (Δ) represents the inter-signal interference from a neighboring cell in a row immediately above a particular cell. In one embodiment in which inter-signal interference between cells in the same row amounts to 2 electrons, the delta may be in a range between about 0 and about 2. The detailed process of the Viterbi algorithm can be as described earlier with reference to FIG. 6A-6J except that the delta is added to the possible number of electrons in each state.

In the embodiments described above, the cells are configured to store one of two states, i.e., single level cells. In other embodiments, multi-level cells can be used to store multi-levels, e.g., more than two states. In such embodiments, a Viterbi algorithm can also be adapted to confirm or correct data read from the cells.

As described above, a Viterbi algorithm may be performed on every row of data bits read during read operations. In certain embodiments, a Viterbi algorithm may be performed only on a selected block of data which is suspected to have at least one error. In other embodiments, a Viterbi algorithm may be performed only on a selected block of data which includes a value close to a threshold value (e.g., 5 electrons where the threshold is 4 electrons) or in response to an uncorrectable error to supplement error correction codes (ECC). A skilled artisan will appreciate that various alternative ways of applying a Viterbi algorithm to NAND flash read operations are also possible. In addition, a skilled artisan will appreciate that any modified Viterbi algorithm or a similar algorithm can also be adapted for flash read operations.

In the embodiments described above, a Viterbi algorithm can be performed by any suitable processor or circuit within the NAND flash memory device. In other embodiments, an external processor or circuit may be provided to perform the Viterbi algorithm. A skilled artisan will appreciate that any suitable configuration of processors circuits can be used for performing the Viterbi algorithm as described above.

A flash memory device according to the embodiments described above can be incorporated in various electronic devices. Examples of the electronic devices can include, but are not limited to, consumer electronic products, electronic circuits, electronic circuit components, parts of the consumer electronic products, electronic test equipments, etc. Examples of the consumer electronic products include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, an optical camera, a digital camera, a washer, a dryer, a washer/dryer, a copier, a facsimile machine, a scanner, a multi functional peripheral device, a wrist watch, a clock, etc. Further, the electronic device can include unfinished products.

One embodiment is a method of retrieving data from a memory cell. The method includes determining values associated with data stored by selected memory cells in an array of memory cells; and processing the determined values in accordance with a Viterbi algorithm so as to determine the data stored in the selected memory cells.

Another embodiment is a method of retrieving data from a memory cell. The method includes sensing an electrical condition of a first memory cell within an array of memory cells; and determining a logical state for the first memory cell based at least in part on the electrical condition and an electrical condition and/or logical state associated with at least one memory cell of the array adjacent to the first memory cell.

Yet another embodiment is an apparatus including an array of memory cells. Each of the memory cells is configured to store charges indicative of a data digit. The apparatus also includes a sense circuit configured to detect values of the charges stored in selected ones of the memory cells. The apparatus is configured to process the detected values in accordance with a Viterbi algorithm.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

We claim:

1. An apparatus comprising:
   an array of flash memory cells arranged in rows and columns, wherein each of the flash memory cells comprises a floating gate transistor having a floating gate configured to store charge indicative of a data digit, and wherein a column of the array comprises a string of at least three floating gate transistors arranged in series from source to drain;
   a sense circuit configured to detect a value associated with the charge indicative of the data digit stored in the floating gate of a selected flash memory cell of the array; and
   a circuit configured to determine a state associated with the data digit of the selected flash memory cell based at least partly on processing the value in accordance with a Viterbi algorithm.

2. The apparatus of claim 1, wherein the circuit is configured to process the value in accordance with the Viterbi algorithm only when the value is included in a block of data determined to have at least one uncorrectable error.

3. The apparatus of claim 1, wherein the array is a NAND flash memory array.

4. The apparatus of claim 1, wherein the string of at least three floating gate transistors is arranged in series between two select transistors.

5. The apparatus of claim 1, further comprising a word line, wherein a row of the array comprises flash memory cells each having a control gate coupled to the word line.

6. The apparatus of claim 1, wherein the selected flash memory cell is adjacent to an adjacent flash memory cell of the array, and wherein the circuit is configured to process the value in accordance with the Viterbi algorithm such that an error assumed to be induced by inter-signal interference from the adjacent flash memory cell on the selected flash memory cell is corrected for determining the state of the data digit of the selected flash memory cell.

7. An apparatus comprising:
   memory cells each comprising a floating gate transistor having a floating gate configured to store charge indicative of a data digit;
   a sense circuit configured to sense an electrical condition of a selected memory cell of the memory cells; and
   a circuit configured to determine a logical state of the selected memory cell based at least in part on the electrical condition sensed by the sense circuit and at least one of an electrical condition or a logical state associated with an adjacent memory cell of the memory cells, so as to compensate for one or more electrons associated with the adjacent memory cell being trapped on the floating gate of the selected memory cell.

8. The apparatus of claim 7, wherein the circuit is configured to determine the logical state based at least partly on performing a Viterbi algorithm.

9. The apparatus of claim 8, wherein the apparatus is configured to supplement error correction using error correction codes by performing the Viterbi algorithm.

10. The apparatus of claim 8, wherein the circuit is configured to perform the Viterbi algorithm only on selected blocks of data which are determined to have an error.

11. The apparatus of claim 8, wherein the circuit further comprises an error correction decoder, wherein the circuit is configured to perform the Viterbi algorithm in response to detecting an error that is uncorrectable by the error correction decoder.

12. The apparatus of claim 8, wherein the apparatus comprises a flash memory device and a processor external to the flash memory device, the flash memory device comprising flash memory cells that include the memory cells, and the processor configured to perform the Viterbi algorithm.

13. The apparatus of claim 7, wherein the memory cells are flash memory cells, and wherein the apparatus is a flash memory device.

14. The apparatus of claim 7, wherein the circuit is further configured to determine the logical state for the selected memory cell based at least partly on a second electrical condition or a second logical state associated with a second adjacent memory cell.

15. The apparatus of claim 7, wherein the memory cells comprise a multi-level cell configured to store more than two states.

16. A method of determining states of data digits stored in a memory array, the method comprising:

detecting values associated with charges indicative of data digits stored by selected memory cells of the memory array to generate detected values, wherein each of the selected memory cells comprises a floating gate transistor configured to store charge indicative of a data digit, and wherein the memory array comprises columns of memory cells, and wherein the columns each comprise at least three floating gate transistors arranged in series from source to drain;

processing the detected values in accordance with a Viterbi algorithm to generate processed detected values; and determining states of the data digits stored by the floating gate transistors of the selected memory cells based at least partly on the processed detected values;

wherein the method is performed by electronic circuits.

17. The method of claim 16, wherein processing compensates for inter-signal interference on at least one of the selected memory cells of the memory array.

18. The method of claim 16, wherein detecting comprises at least one of sensing a current or sensing a threshold voltage value.

19. The apparatus of claim 7, wherein the memory cells are included in an array of NAND flash memory cells.

20. The apparatus of claim 7, wherein memory cells comprise at least three floating gate transistors arranged in series from source to drain.

* * * * *